United States Patent [19]
Worcester

[11] 3,750,030

[45] July 31, 1973

[54] FREQUENCY SWITCHING CIRCUITRY FOR VARACTOR TUNED RADIO RECEIVERS

[75] Inventor: Joseph A. Worcester, Frankfort, N.Y.

[73] Assignee: General Electric Company, Syracuse, N.Y.

[22] Filed: Dec. 29, 1970

[21] Appl. No.: 102,304

[52] U.S. Cl. .................................. 325/422, 325/468

[51] Int. Cl. ............................................ H04b 1/26

[58] Field of Search .................. 334/11, 14, 15, 16; 325/335, 373, 420, 422, 468, 469, 470, 418, DIG. 1

[56] References Cited

UNITED STATES PATENTS

| | | | |
|---|---|---|---|
| 3,354,397 | 11/1967 | Wittig | 325/DIG. 1 |
| 3,528,043 | 9/1970 | Richter et al. | 334/15 |
| 3,440,544 | 4/1969 | Pampel | 325/422 |

*Primary Examiner*—Robert L. Griffin
*Assistant Examiner*—Joseph A. Orsino, Jr.
*Attorney*—Marvin A. Goldenberg, W. J. Shanley, Jr., Frank L. Neuhauser, Oscar B. Waddell and Joseph B. Forman

[57] ABSTRACT

In a varactor tuned radio receiver which utilizes scan circuitry to tune the receiver, frequency switching circuitry is provided for developing a voltage across a scan control capacitor for application to the scan circuitry to tune the receiver to within a particular range of the desired frequency within one of a plurality of spreadbands. The frequency switching circuitry includes first, second, and third variable resistances connected in circuit with the scan control capacitor. Adjustment of the first variable resistance tunes the receiver to within a first relatively broad range within a desired spreadband. Adjustment of the second variable resistance tunes the receiver to within a second narrower range within the first range. The third variable resistance is ganged to the first variable resistance and is simultaneously adjusted to compensate for small nonlinearities in the voltage versus capacitance characteristic of the varactor.

6 Claims, 2 Drawing Figures

INVENTOR:
JOSEPH A. WORCESTER,

BY

HIS ATTORNEY.

FREQUENCY SWITCHING CIRCUITRY FOR VARACTOR TUNED RADIO RECEIVERS

BACKGROUND OF THE INVENTION

The present invention relates to radio receivers and more particularly to frequency switching circuitry for a varactor tuned radio receiver.

When scan circuitry is utilized within a varactor tuned radio receiver, the application of a varying voltage reversely across the varactor enables one to scan the entire range of frequencies, within a particular spreadband, until one of sufficient strength is encountered. However, if one desires to tune to a particular frequency, but there are several frequencies of sufficient strength between the desired frequency and the frequency to which the scan circuitry is presently locked, the scan circuitry will lock onto each frequency of sufficient strength as it scans toward the desired frequency. To reach the desired frequency necessitates a decoupling of the scan circuitry from each frequency that it locks onto until the desired frequency is encountered. Obviously this approach is time consuming and annoying to the listener who desires to listen to a particular frequency.

SUMMARY OF THE INVENTION

The present invention overcomes the above noted problem by providing frequency switching circuitry to tune the receiver to within a particular range of the desired frequency and then activating the scan circuitry to lock onto the desired frequency.

Accordingly, it is the object of the present invention to provide frequency switching circuitry for a varactor tuned radio receiver to digitally tune to within a particular range of a desired frequency within a particular spreadband.

It is a further object of the present invention to provide frequency switching circuitry for a varactor tuned radio receiver which may be easily tuned to a particular station without the need for an elaborate scale calibration.

Briefly stated, in accordance with one aspect of the invention, there is provided frequency switching circuitry for a varactor tuned radio receiver which utilizes scan circuitry to tune the receiver. The frequency switching circuitry is comprised of a plurality of resistor matrices and switching means for connecting various combinations of resistance values into the circuit so as to selectively impress predetermined voltages on the varactors of the tuning circuitry to tune the receiver to within a particular range of the desired frequency within a particular spreadband.

BRIEF DESCRIPTION OF THE DRAWINGS

While the specification concludes with claims particularly pointing out and distinctly claiming the subject matter which is regarded as the invention, it is believed that the invention will be better understood from the following description, taken in connection with the accompanying drawings in which:

DETAILED DESCRIPTION OF THE PREFERRED EMBODIMENT

Figure 1:
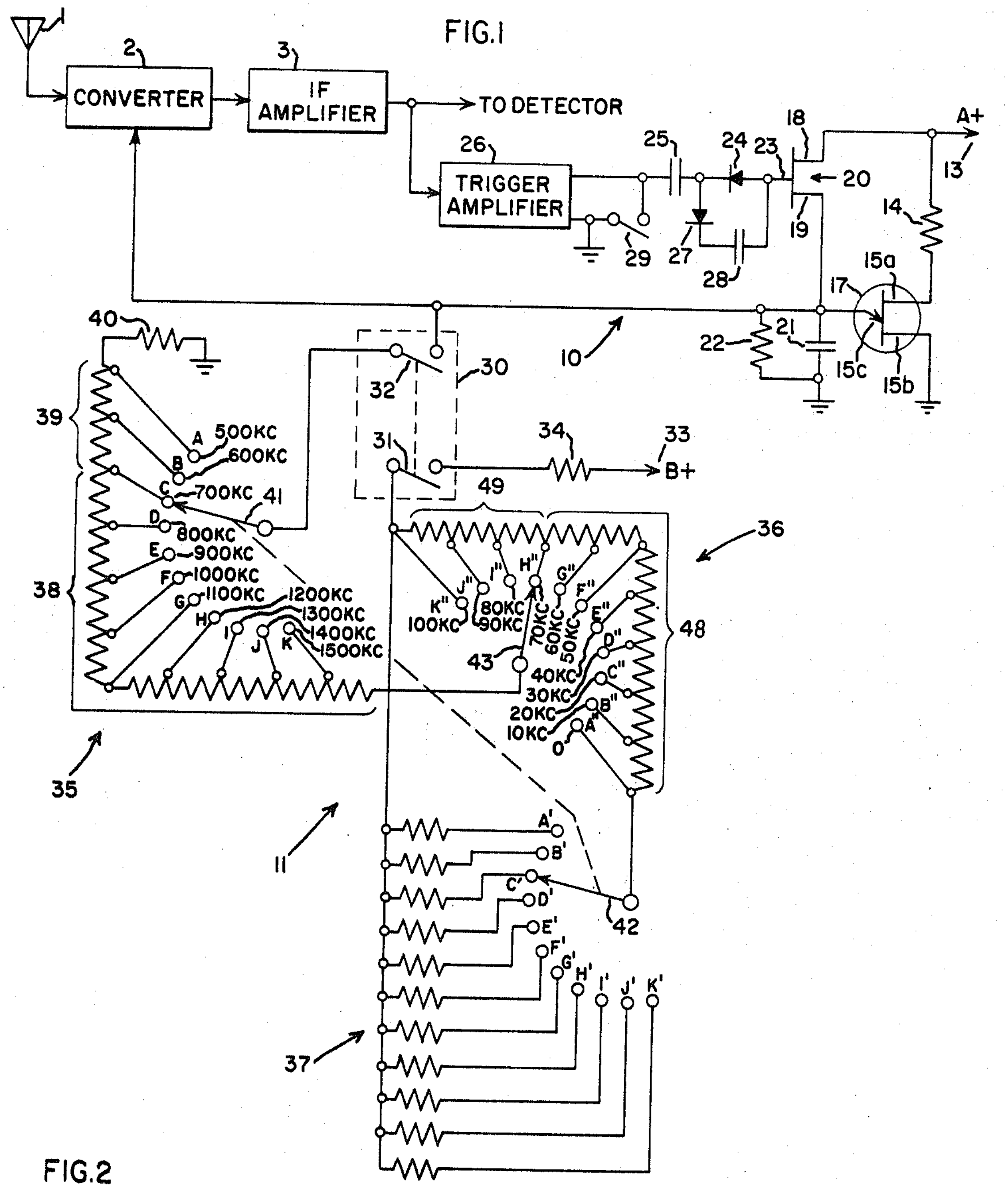
FIG. 1 is a schematic circuit diagram of a scan tuned radio receiver incorporating digital frequency switching circuitry in accordance with the present invention.

Referring to the drawings, and more particularly to FIG. 1, there is illustrated a schematic circuit diagram of the tuner and intermediate frequency amplifier circuitry of a scan tuned radio receiver which is shown to include an antenna 1 coupled to a converter stage 2 in which the received radio frequency signal is tuned and converted down to an intermediate frequency signal by mixing with a local oscillator signal. The converter stage 2 may be a conventional autodyne converter component which includes tuning means in the form of varactor diodes for tuning the incoming and local oscillator signals. The output of stage 2 is coupled to an IF amplifier stage 3, which in turn is connected to the receiver detector circuit, not shown.

The output of the IF amplifier stage 3 is further coupled to scan tuning circuitry 10 which provides a control voltage applied to the varactor diodes of the converter stage 2 for tuning purposes. In accordance with the invention, frequency switching circuitry 11 is connected to the scan tuning circuitry 10 for selecting the range of frequencies within which scan tuning is to occur. The frequency switching circuitry 11 employs digital techniques for selecting discrete voltages to be applied to the scan tuning circuitry 10 so as to establish tuning of the receiver within a particular range of frequencies within a given spreadband. The switching function, per se, may be implemented in a number of conventional ways, such as through dial switching, push button switching, etc.

While the scan circuitry 10, per se, forms no part of the present invention, an explanation of its design and operation is included for the sake of completeness. The scan circuitry includes a DC power source 13 of positive voltage which is connected through a resistor 14 to the base-one 15*a* of a unijunction transistor 17, base-two 15*b* being connected to ground. The power source 13 is also connected through the series path of source-drain terminals 18 and 19 of a field effect transistor 20 and a scan control capacitor 21 to ground. The ungrounded side of capacitor 21 is further connected to the emitter 15*c* of unijunction transistor 17, with a resistor 22 connected in parallel with said capacitor to aid in the charging and discharging thereof. The junction of resistor 22 and capacitor 21 is connected to converter stage 2 for controlling the voltage across the varactor diodes therein contained to thus vary the frequency to which the radio receiver is tuned. The gate terminal 23 of the field effect transistor 20 is connected in series with a diode 24, poled to conduct current away from said gate terminal, and a capacitor 25 to one output terminal of a narrow bandpass trigger amplifier 26. In parallel with the diode 24 is connected the series connection of a diode 27 and a capacitor 28, diode 27 being tied to the junction of diode 24 and capacitor 25 and poled to conduct current toward gate terminal 23. A normally open switch 29 is included to momentarily short the output terminals of the trigger amplifier 26 when it is desired to change the frequency to which the radio receiver is tuned.

The frequency switching circuitry 11 includes switching means 30 for applying across the scan capacitor 21 discrete voltages which determine the range of frequencies within which tuning is to occur. The switching means 30 includes first and second ganged switches 31 and 32, each of which has a normally open position and a momentarily closed position. The frequency switching circuitry further includes a DC power source 33, which is connected through a first fixed resistor 34 and switch 31 to first, second, and third variable resistance means 35, 36 and 37.

For purposes of explanation of the design and operation of the frequency switching circuitry, tuning within the broadcast band will be considered. The first variable resistance means 35 includes series related tapped resistor segments 38 and 39, and a fixed resistor 40. Resistor segments 38 and 39 are selectively tapped at appropriate points A to K by means of switch 41 for providing a coarse adjustment of voltage applied to capacitor 21. Taps A to K may, for purposes of example, be assumed to correspond to 100 KHz increments, from 500 to 1,500 KHz within a particular spreadband. Switch 41, therefore, may be employed to select a resistance value which will tune the receiver to within 100 KHz of the desired frequency, in the present example. The fixed resistor 40 is connected in series with resistor 39, the value of which depends upon the position of switch 41.

The third variable resistance means 37, which includes a plurality of resistor segments A' to K' is set to an appropriate setting by switch 42, which is ganged to switch 41 to modify each setting of the first variable resistance means 35. Thus, third variable resistance means 37 is employed to compensate for slight nonlinearities in the voltage vs. frequency response of the varactors and to insure that the required frequency range, in this instance 100 KHz, is properly covered at all settings of the first variable resistance means.

The second variable resistance means 36 includes tapped resistor segments 48 and 49, which are tapped at appropriate points A'' to K'' by means of switch 43 for providing a fine adjustment of voltage applied to capacitor 21. Taps A'' to K'' may be assumed to correspond to 10 KHz increments within the particular 100 KHz band previously tuned, being set by switch 43 to a resistance value so as to tune the radio receiver to within 10 KHz below the desired frequency. Accordingly, in the example under consideration, a particular setting of the frequency switching circuitry will impress a voltage on the scan capacitor for tuning the receiver to within 10 KHz below the desired frequency within a particular spreadband, and the scan circuitry will then exactly tune to the desired frequency.

Figure 2:
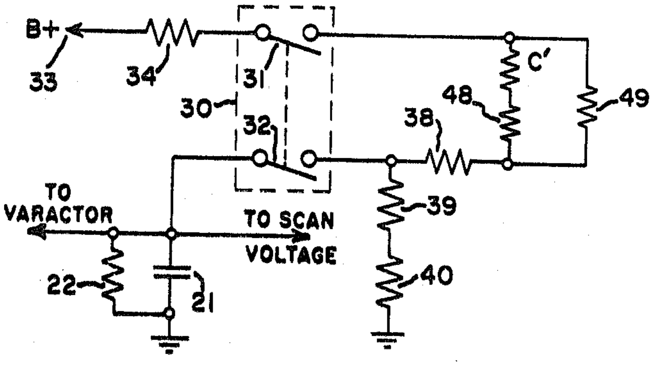
FIG. 2 is the circuit equivalent of the tuning resistors of the present invention.

In FIG. 2, for the particular setting of each of the variable resistance means shown in FIG. 1, the circuit equivalent of the tuning resistors within the frequency switching circuitry is shown. The DC power source 33 is connected in series with fixed resistance 34 and through switch 31 to a parallel combination of resistor 49 connected across the serial connection of resistor C' and resistor 48. This parallel combination is connected through the voltage divider arrangement of resistor 38, resistor 39 and resistor 40. Resistor 40 is connected to ground, and the junction of resistor 38 and 39 is connected through switch 32 to one side of scan capacitor 21, the other side being tied to ground.

While the resistors of the frequency switching circuitry have been described as calibrated for the broadcast band for purposes of this description, it will be obvious to those skilled in the art that the resistors could be calibrated to any other spreadband without departing from the true spirit and scope of the invention.

Considering the operation of the circuit of FIG. 1, it will first be assumed that there is no charge upon the scan capacitor 21 and the radio receiver is not tuned to a frequency of sufficient signal strength to be detected. When the scan tuning circuitry is activated, the scan capacitor 21 will begin charging from the DC power supply 13 through the field effect transistor 20. The field effect transistor is of the type which allows complete conduction between its source-drain terminals, 18 and 19, when no signal is applied to the gate 23. As the capacitor charges, the varactor is subjected to an increasing voltage which in turn tunes the radio receiver through the range of frequencies of a particular spreadband until a frequency of sufficient signal strength is encountered. When a sufficiently strong frequency is encountered, the narrow bandpass trigger amplifier 26 applies a voltage to the gate of the field effect transistor 20 which decreases conduction through said transistor. A point is reached where the effective resistance between source-drain terminals 18 and 19 in combination with resistance 22 provides an equilibrium condition with respect to the charging of scan capacitor 21. Scanning of the frequency band is thereby terminated. Since the trigger amplifier has an extremely narrow bandpass, the point at which charge on the scan capacitor is stabilized can be made to correspond closely with the desired frequency and to avoid any appreciable detuning.

Should the station fade, the voltage on the gate of the field effect transistor 20 is removed and the scan capacitor 21 once again commences charging until a signal of sufficient strength to activate the trigger amplifier is encountered. The scan is then terminated in the manner described above. If the scan capacitor does not encounter a signal before it reaches the end of the spreadband, the charge on the capacitor is sufficient to fire the unijunction transistor 17 and cause the capacitor to discharge therethrough. Once the capacitor reaches zero voltage, the unijunction transistor ceases conduction and the charging process commences at the lower end of the spreadband, continuing until another sufficiently strong station is encountered.

If a scan capacitor is locked on a particular station and one desires to sequentially find the next station of sufficient signal strength, normally-open switch 29, which is across the output of the trigger amplifier, is closed so as to remove the signal on the gate of the field effect transistor 20. This causes the scan capacitor to commence charging until the next station of sufficient strength is encountered. Once a station is encountered, the scan circuitry will lock on that station in a manner similar to that previously discussed.

However, if one desires to tune immediately to a particular station within the spreadband which is not adjacent to the station upon which the scan circuitry is presently locked, this is readily accomplished by digital techniques by means of the frequency switching circuitry 11. Accordingly, the switch 41 of the first variable resistance means 35 is set for coarse adjustment to a particular first range within which the desired station is included. In the present example of the broadcast band the first range is a multiple of 100 KHz. In the particular setting shown in FIG. 1, the switch 41 is connected to tap C. Since switch 42 is ganged to switch 41, the appropriate modifying resistor C' within the third variable resistance means 37, will also be connected in the circuit to compensate for nonlinearities in the voltage vs. frequency response of the varactor.

The second variable resistance means 36 is selectively engaged at one of its taps A'' to K'' by means of switch 43 to provide a fine adjustment to a second, narrow range within the previously mentioned first range, said second range starting below the desired frequency. In the present example the second range is a multiple of 10 KHz. The switching means 30 is then momentarily closed in order to impress a selected predetermined voltage across scan capacitor 21 which will correspond to a frequency which is within a 10 KHz range below the desired frequency. Once the new voltage is impressed upon the scan capacitor, the radio receiver is detuned from the station to which it was formerly tuned so that the signal on the gate of the field effect transistor 20 has been removed. This allows the scan capacitor 21 to continue charging until it reaches the desired frequency. Thus, it can be seen that by the manual setting of the frequency circuitry 11, one can utilize the scan circuitry to tune to any station within a particular spreadband whether or not the frequency is directly adjacent to the frequency to which the scan circuitry was previously tuned.

I claim:

1. A varactor tuned receiver utilizing scan circuitry and a scan control capacitor to tune the receiver by selectively impressing predetermined voltages on the varactors of said receiver, comprising:

a. first variable resistance means for providing a coarse tuning adjustment of said receiver, b. second variable resistance means for providing a fine tuning adjustment of said receiver, c. first means for digitally setting the value of said first resistance means, d. second means for digitally setting the value of said second resistance means and for coupling together said first and second resistance means, e. third variable resistance means having a resistance characteristic matched to that of said first resistance means for providing compensation for the nonlinear voltage versus frequency properties of said varactors, f. third means for digitally setting the value of said third resistance means and for coupling together said second and third resistance means, said third means being coupled in cooperative relationship with said first means so that the values of said first and third resistance means are set together, and g. switching means for momentarily coupling said first, second and third resistance means in circuit with a voltage source and said scan capacitor so as to apply a voltage to said capacitor that is in accordance with the combined values of said first, second and third resistance means, thereby selecting a particular range of frequencies within a given spreadband for tuning of the receiver.

2. A varactor tuned receiver as in claim 1 wherein said first variable resistance means comprises a first pair of resistor segments coupled between one side of said voltage source and said second means, said first pair of resistor segments having a first set of multiple taps, and wherein said first means selectively connects one of said multiple taps to said switching means so as to place said first pair of resistor segments in a voltage divider arrangement, the connection being made so that as the value of one of said first pair of resistor segments is changed, the value of the other changes in reciprocal relationship therewith.

3. A varactor tuned receiver as in claim 2 wherein said second variable resistance means comprises a second pair of resistor segments coupled between the other side of said voltage source and said third means, said second pair of resistor segments having a second set of multiple taps, and wherein said second means selectively connects one of said second set of multiple taps to said first resistance means so as to place said second pair or resistor segments in a parallel arrangement, the connection being made so that as the value of one of said second pair of resistor segments is changed, the value of the other changes in reciprocal relationship therewith.

4. A varactor tuned receiver as in claim 3 wherein said first and second means each comprise a multiple contact switch for connecting, respectively, to the multiple taps of said first and second pair of resistor segments.

5. A varactor tuned receiver as in claim 4 wherein said third variable resistance means comprises a plurality of resistor segments joined together at one end and coupled to said other side of said voltage source, and said third means connects the other ends of said plurality of resistor segments in series with one of said second pair of resistor segments.

6. A varactor tuned receiver as in claim 5 wherein said third means comprises a multiple contact switch ganged together with the multiple contact switch of said first means for connecting to said plurality of resistor segments.

* * * * *